(12) United States Patent
Lee

(10) Patent No.: US 7,428,170 B2
(45) Date of Patent: Sep. 23, 2008

(54) VOLTAGE GENERATION CIRCUIT, FLASH MEMORY DEVICE INCLUDING THE SAME AND METHOD FOR PROGRAMMING THE FLASH MEMORY DEVICE

(75) Inventor: Doo-Sub Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 11/604,227

(22) Filed: Nov. 27, 2006

(65) Prior Publication Data

US 2008/0089142 A1 Apr. 17, 2008

(30) Foreign Application Priority Data

Oct. 12, 2006 (FR) ...................... 10-2006-0099156

(51) Int. Cl.
*G11C 16/04* (2006.01)
*G11C 16/06* (2006.01)

(52) U.S. Cl. ............................ 365/185.19; 365/185.18; 365/185.23; 365/185.28; 365/189.09

(58) Field of Classification Search ............. 365/185.19
See application file for complete search history.

(56) References Cited

U.S. PATENT DOCUMENTS 6,469,933 B2 * 10/2002 Choi et al. ............. 365/185.17
7,072,238 B2 * 7/2006 Chae et al. ................... 365/226
7,239,554 B2 * 7/2007 Jeong ..................... 365/185.28
7,245,537 B2 * 7/2007 Jeong ..................... 365/185.22
7,274,598 B2 * 9/2007 Cho et al. .............. 365/185.18
7,280,415 B2 * 10/2007 Hwang et al. .......... 365/189.09
2006/0092703 A1 * 5/2006 Chae et al. ............. 365/185.18
2007/0297238 A1 * 12/2007 Cho et al. .............. 365/185.23

FOREIGN PATENT DOCUMENTS

| KR | 142368 | 3/1998 |
|---|---|---|
| KR | 0290282 | 2/2001 |
| KR | 0418719 | 2/2004 |
| KR | 1020060056687 A | 5/2006 |
| KR | 2006-0066958 | 6/2006 |

* cited by examiner

*Primary Examiner*—Son L Mai
(74) *Attorney, Agent, or Firm*—Volentine & Whitt, PLLC

(57) ABSTRACT

A voltage generation circuit of a flash memory device includes a high voltage generator, a word line voltage generator, and a column selection voltage switch. The high voltage generator is configured to increase an internal power voltage from a first voltage to a second voltage which is higher than the first voltage. The word line voltage regulator is configured to generate an incremental step pulse based on the internal power voltage, where the incremental step pulse is output as a word line program voltage before the internal power voltage reaches the second voltage. The column selection voltage switch is configured to output a column selection voltage for selecting a bit line based on the internal power voltage.

27 Claims, 9 Drawing Sheets

100

VOLTAGE GENERATION CIRCUIT, FLASH MEMORY DEVICE INCLUDING THE SAME AND METHOD FOR PROGRAMMING THE FLASH MEMORY DEVICE

BACKGROUND OF THE INVENTION

1. Field of the Invention

The present invention generally relates to memory devices, and more particularly, the present invention relates to a voltage generation circuit of a flash memory device, a flash memory device including a voltage generation circuit, and a method of programming a flash memory device.

A claim of priority under 35 USC § 119 is made to Korean Patent Application No. 10-2006-0099156, filed Oct. 12, 2006, in the Korean Intellectual Property Office, the disclosure of which is incorporated herein in its entirety by reference.

2. Description of the Related Art

An EEPROM (Electrically Erasable and Programmable ROM) is a type of non-volatile memory device which retains stored data in the absence of supplied power. Generally, an EEPROM operates in one of three modes, namely, a program mode for writing data to a memory cell, a read mode for reading stored data, and an erase mode for erasing the stored data.

A flash memory device is an EEPROM which is characterized by simultaneously executing an erase operation in units of memory blocks or memory sectors. Depending on its memory cell array structure, a flash memory devices may be either a NAND type flash memory device or a NOR type flash memory device. In a NAND type flash memory device, cell transistors are connected to each other in series between a bit line and a ground electrode. In a NOR type flash memory device, cell transistors are connected in parallel between a bit line and a ground electrode. The NOR type flash memory device has the advantage of random data access by performing a read operation and a program operation per byte, but has the disadvantage of slow programming and erase speeds when compared with the NAND type flash memory device.

FIG. 1 is a simplified block diagram illustrating a conventional flash memory device.

Referring to FIG. 1, the flash memory device includes a memory cell array 10, a row selection circuit 20, a column selection circuit 30 and a write driver 40.

The memory cell array 10 includes memory cells such as cell transistors, which are respectively coupled to one of a plurality of word lines and to one of a plurality of bit lines. Among a plurality of cell transistors included in the NOR type memory cell array 10, only a single cell transistor 11 selected to be programmed is illustrated in FIG. 1.

The row selection circuit 20 decodes a row address signal ADDX and selects a word line 12 coupled to the cell transistor 11 to be programmed. A word line program voltage VPW is applied to a control gate of the cell transistor through the selected word line 12. Electrons are injected into a floating gate due to the high voltage applied to the control gate so that a selected cell is programmed.

In the program mode of the NOR type flash memory, for example, the program operation is performed by applying a high voltage not less than about 4V to the bit line and applying a high voltage of about 10V to the word line. For example, both of the high voltages may be generated by a charge pump. In a typical NOR type flash memory device, the program operation is performed when the two high voltages generated by the charge pump reach a target maximum value.

As shown in FIG. 1, the column selection circuit 30 may include a local column decoder 31, a global column decoder 32, level shifters 33 and 34 and selection transistors 35 and 36. The column selection circuit 30 decodes a column address ADDY and selects a bit line 13 including the cell transistor 11 to be programmed.

Typically, bit lines of memory devices have a hierarchical structure including a local bit line coupled to a predetermined number of memory cells and a global bit line coupled in common to a plurality of the local bit lines. Only a single local bit line 13 and a single global bit line 14, which are selected, are shown in FIG. 1. The bit line may be selected by switching operations of the local bit line selection transistor 35 and the global bit line selection transistor 36. The column decoders 31 and 32 decode the column address signal ADDY and output selection signals for selecting a bit line. The level shifters 33 and 34 increase a voltage level of the selection signals to a column selection voltage VPPY that is provided as a gate voltage of the bit line selection transistors 35 and 36.

The write driver 40 receives program data DQ, and increases a voltage level of the program data DQ by a bit line program voltage VPB and then outputs the voltage-increased program data DQ to the column selection circuit 30. In the flash memory device, a high voltage is applied to the bit line in the program operation. Particularly, in the NOR type flash memory device, a bit line program voltage not less than about 4V is needed when a word line program voltage is about 10V in order to perform the program operation by channel hot electron (CHE) injection. In order to transfer this high voltage from the write driver 40 to the selected local bit line without loss, high voltage should be applied to the gates of the selection transistors 35 and 36 on the path. Accordingly, the column selection voltage VPPY should be greater than a certain voltage level so that the level shifters 33 and 34 may output a sufficiently high gate voltage.

FIG. 2 is a block diagram illustrating a conventional voltage generation circuit of a flash memory device.

Referring to FIG. 2, the voltage generation circuit 100 of the flash memory device includes a high voltage generator 110, a word line voltage regulator 120 and a column selection voltage switch 130.

The high voltage generator 110 generates and outputs a high voltage VPI based on a power voltage, and generates the high voltage setup signal SUVPI representing that the high voltage VPI is set up to a maximum value. A charge pump may be included in the high voltage generator 110 as a means for increasing a voltage.

A word line voltage regulator 120 receives the high voltage VPI from the high voltage generator 110 and generates an incremental step pulse. The word line voltage regulator 120 begins to output the incremental step pulse to the row selection circuit 20 in response to a program setup signal SUPGM. For example, a controller of the flash memory device may generate a control signal CTLREG in response to the program setup signal SUPGM, and the word line voltage regulator 120 gradually increases a voltage level of the incremental step pulse in response to the control signal CTLREG. The row selection circuit 20 in FIG. 1 outputs the received incremental step pulse as a word line program voltage VPW to the selected word line.

As mentioned above, the word line voltage regulator 120 performs a program operation by using an incremental step pulse programming (ISPP) scheme in which a gradually increasing voltage is used as a word line program voltage.

The column selection voltage switch 130 receives the high voltage VPI from the high voltage generator 110 and outputs a column selection voltage for selecting a bit line. Since the column selection voltage of a high value is required in the program mode, the column selection voltage switch 130 outputs the high voltage VPI in the program mode and outputs a read column selection voltage VPRDY which is lower than the high voltage VPI in the read mode.

FIG. 3 is a timing diagram for describing an operation of the voltage generation circuit in FIG. 2.

The high voltage generator 110 starts boosting of the power voltage VDD in response to a program enable signal that is activated at time t0, and outputs the high voltage VPI. The high voltage generator 110 outputs a high voltage setup signal SUVPI that is activated when the high voltage VPI is set up to the maximum value V2 at time t2. The word line voltage regulator 120 receives the high voltage VPI from the high voltage generator 110 and generates an incremental step pulse. The word line voltage regulator 120 generates a word line voltage setup signal SUVPW that is activated when a first voltage level of the incremental step pulse is set up at time t1.

Since the column selection voltage VPPY of a high value is required in the program mode, the word line voltage regulator 120 outputs the word line program voltage VPW in the form of the incremental step pulse when the high voltage VPI used as the column selection voltage VPPY is set up to the maximum value. The voltage generation circuit 100 may include a timing control circuit 140 for triggering the output of the incremental step pulse. The timing control circuit 140 generates a program setup signal SUPGM which is activated when both the high voltage setup signal SUVPI and the word line voltage setup signal SUVPW are activated. The controller of the flash memory device may generate the control signal CTLREG in response to the program setup signal SUPGM, and the word line voltage regulator 120 may begin to gradually increase a voltage level of the incremental step pulse in response to the control signal CTLREG.

As shown in FIG. 3, the conventional voltage generation circuit 100 outputs the incremental step pulse after a delay time TD1. The delay time TD1 is needed for setting up the high voltage VPI, which is used as the column selection voltage VPPY, to the maximum value in the program mode. In this case, a program time is equivalent to a sum of the delay time TD1 and the step pulse output time TSP as shown in FIG. 3. Accordingly, the program time is increased as a result of the requirement that the column selection voltage VPPY should be greater than a certain voltage level, thereby degrading performance of the flash memory device.

SUMMARY OF THE INVENTION

According to an aspect of the present invention, a voltage generation circuit of a flash memory device is provided. The voltage generation circuit includes a high voltage generator, a word line voltage generator, and a column selection voltage switch. The high voltage generator is configured to increase an internal power voltage from a first voltage to a second voltage which is higher than the first voltage. The word line voltage regulator is configured to generate an incremental step pulse based on the internal power voltage, where the incremental step pulse is output as a word line program voltage before the internal power voltage reaches the second voltage. The column selection voltage switch is configured to output a column selection voltage for selecting a bit line based on the internal power voltage.

According to another aspect of the present invention, a flash memory device is provided which includes a controller configured to control a program operation, a memory cell array including a plurality of cell transistors that are respectively coupled to one of a plurality of word lines and to one of a plurality of bit lines, a row selection circuit configured to select one of the word lines based on a row address signal and to apply a word line program voltage to the selected word line in program mode, a column selection circuit configured to select one of the bit lines based on a column address signal and to apply program data to the selected bit line in program mode, a write driver configured to output the program data based on a bit line program voltage, and a voltage generation circuit. The voltage generation circuit is configured to output an incremental step pulse as a word line program voltage to the row selection circuit before an internal power voltage is increased to a maximum voltage from an initial voltage, and to output a column selection voltage for selecting a bit line to the column selection circuit based on the internal power voltage.

According to still another aspect of the present invention, a method for programming flash memory device is provided. The method includes increasing an internal power voltage from a first voltage to a second voltage which is higher than the first voltage, outputting a column selection voltage for selecting a bit line based on the internal power voltage, generating an incremental step pulse based on the internal power voltage, and outputting the incremental step pulse as a word line program voltage before the internal power voltage reaches the second voltage from the first voltage level.

BRIEF DESCRIPTION OF THE DRAWINGS

The above and other aspects and features of the present invention will become readily apparent from the detailed description that follows, with reference to the accompanying drawings, in which.

DESCRIPTION OF THE EMBODIMENTS

Figure 1:
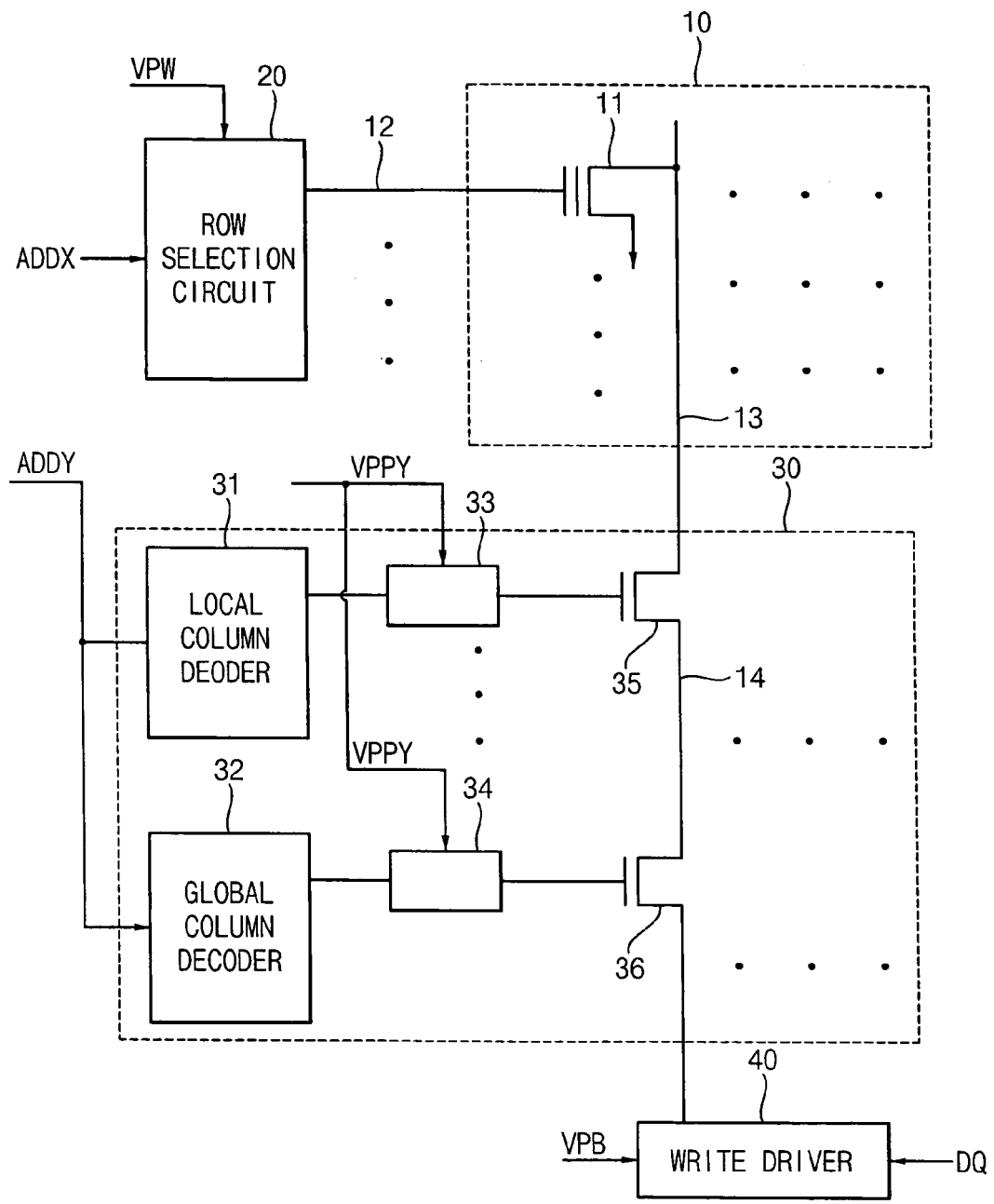
FIG. 1 is a block diagram illustrating a conventional flash memory device.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
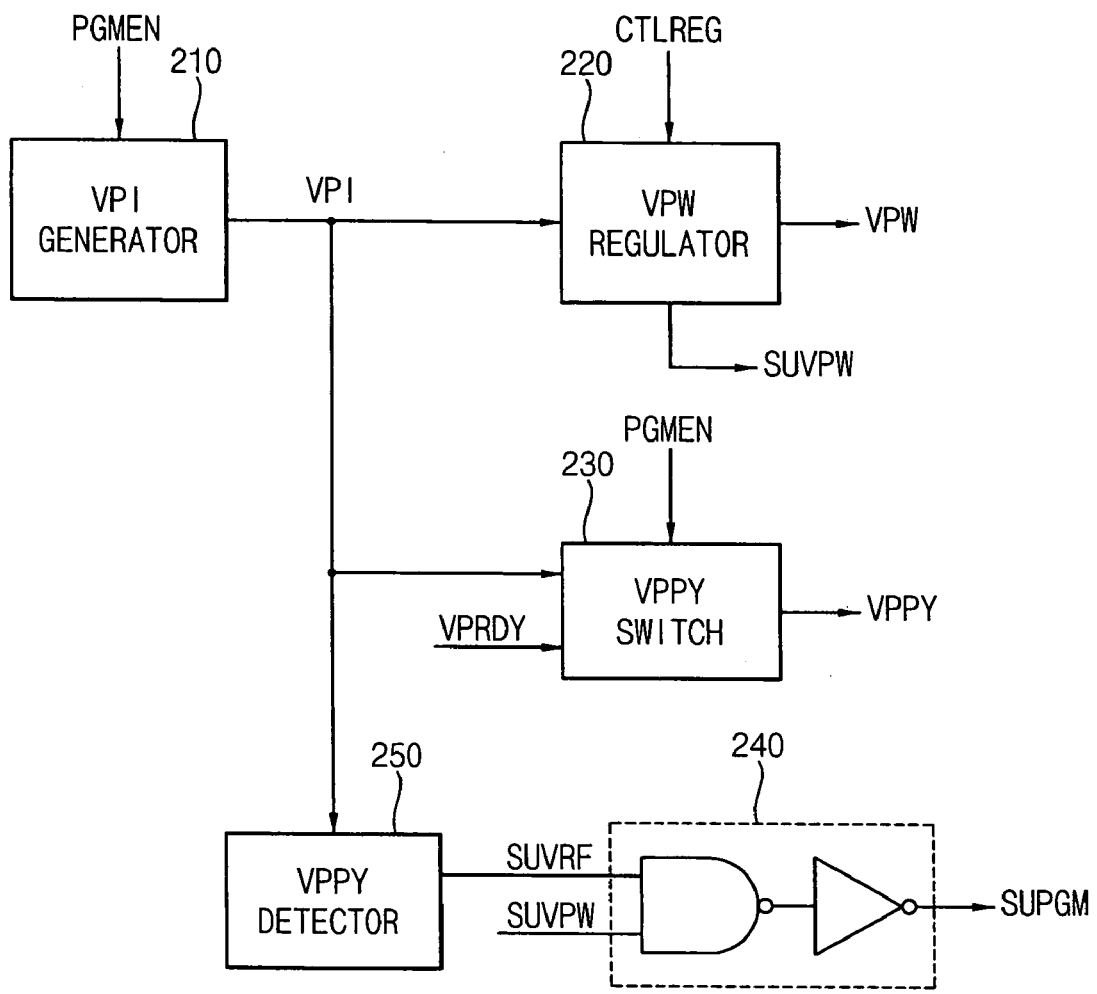
FIG. 4 is a block diagram illustrating a voltage generation circuit of a flash memory device according to an embodiment of the present invention.

FIG. 4 is a block diagram illustrating a voltage generation circuit of a flash memory device according to an embodiment of the present invention.

Referring to FIG. 4, the voltage generation circuit 200 of a flash memory device includes a high voltage generator 210, a word line voltage, regulator 220 and a column selection voltage switch 230. Also, as explained herein below, the voltage generation circuit 200 may further include a high voltage detector 250 and a timing control circuit 240.

The high voltage generator 210 generates a high voltage VPI as an internal power voltage based on a power supply voltage (not shown). The power supply voltage may be any of a number of supply voltages produced by the flash memory device. For example, the high voltage generator 210 may include a charge pump which increases a power supply voltage VDD so as to generate the high voltage VPI. Further, for example, the high voltage generator 210 may be activated in response to a program enable signal PGMEN which indicates the start of a program operation.

Figure 5:
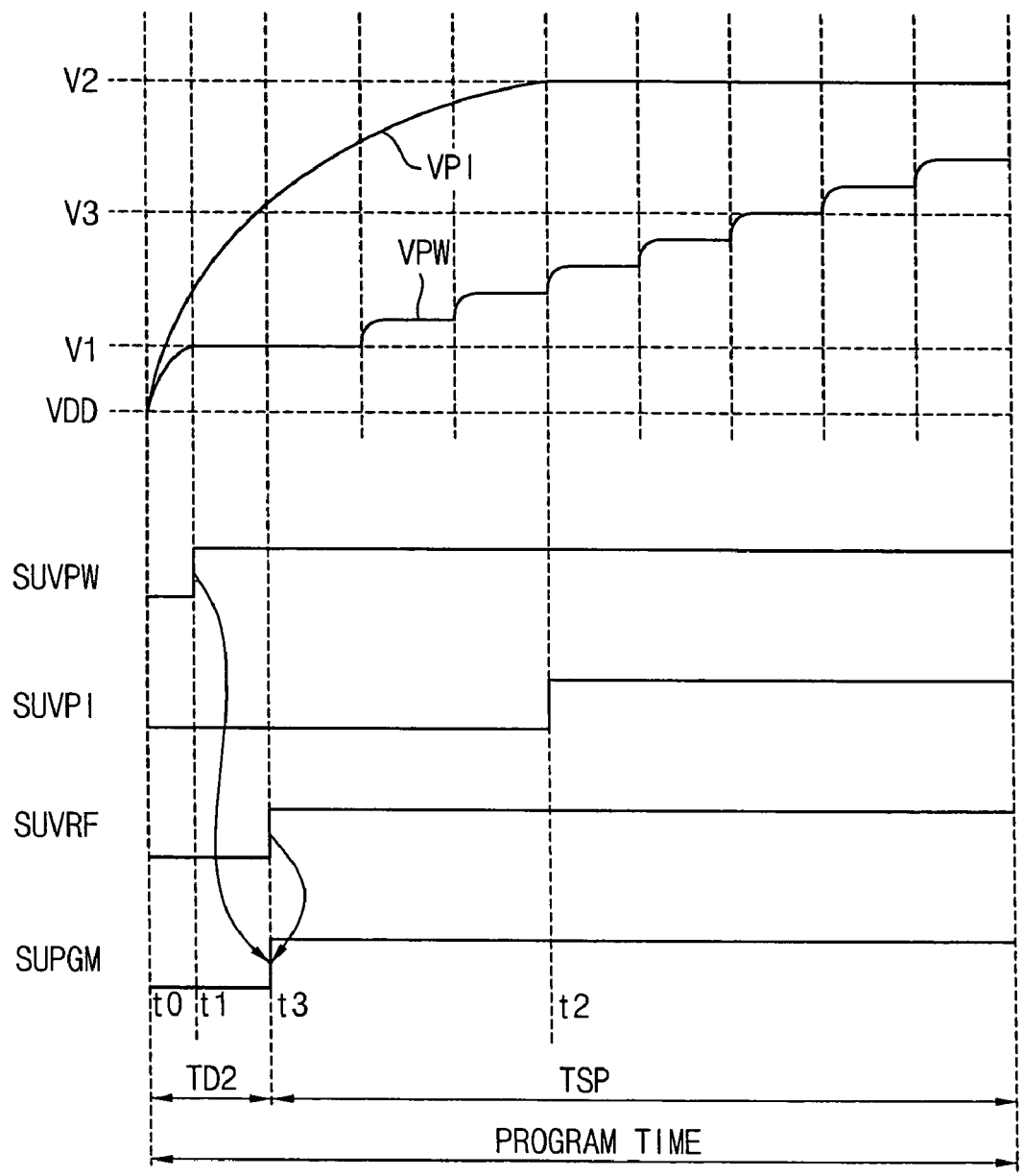
FIG. 5 is a timing diagram for describing an operation of the voltage generation circuit shown in FIG. 4.

Referring additionally to FIG. 5 (which will be described in greater detail herein below), the word line voltage regulator 220 generates an incremental step pulse based on the high voltage VPI, and outputs the incremental step pulse as the word line program voltage VPW before the high voltage VPI reaches its maximum value V2 from a power supply voltage VDD. The word line voltage regulator 220 outputs the incremental step pulse to a row selection circuit of the flash memory device in response to, for example, a program setup signal SUPGM. For example, a controller of the flash memory device may generate a control signal CTLREG in response to the program set up signal SUPGM and a word line voltage regulator 220 may gradually increase a voltage level of the incremental step pulse in response to the control signal CTLREG.

Figure 7:
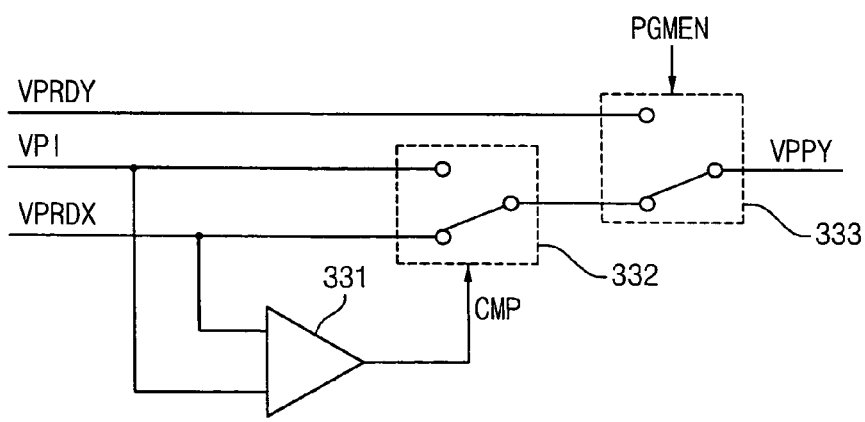
FIG. 7 is a circuit diagram illustrating an embodiment of the column selection voltage switch shown in FIG. 6.

The column selection voltage VPPY switch 230 outputs a column selection voltage VPPY for selecting a bit line based on the high voltage VPI. The column selection voltage switch 230 outputs the high voltage VPI as the column selection voltage VPPY in a program mode, and outputs a read column selection voltage VPRDY as the column selection voltage VPPY in a read mode. The read column selection voltage VPRDY is lower than the high voltage VPI. The column selection voltage switch 230 may be implemented by a mode switching unit as illustrated in FIG. 7 for selectively outputting voltage VPI or VPRDY according to an operation mode. The mode switching unit may be responsive to the program enable signal PGMEN, selects a voltage corresponding to one of a program mode and a read mode, and outputs the selected voltage as the column selection voltage.

The voltage generation circuit may further include a high voltage detector 250 and a timing control circuit 240 so as to reduce a program time of the flash memory device.

Referring again to FIG. 5, the high voltage detector 250 may generate a reference voltage setup signal SUVRF that is activated when the high voltage VPI is higher than a reference voltage. V3 by comparing the high voltage VPI with the reference voltage. The reference voltage may be determined according to the given implementation of the memory device. For example, the reference voltage may be provided as a mode resistor set (MRS) signal or may be stored as a fixed value in the high voltage detector 250. The reference voltage may be set to a minimum value of the column selection voltage for operating a bit line selection transistor in a program mode. Therefore, the reference voltage setup signal SUVRF is activated when a gate voltage of the column selection transistor for selecting the bit line becomes a sufficient voltage level.

The timing control circuit 240 generates the program setup signal SUPGM by performing a logical operation on the word line voltage setup signal SUVPW and the reference voltage set up signal SUVRF. For example, the timing control circuit 240 may be implemented by logic elements such as a NAND operator and an inverter shown in FIG. 4, in which case the word line voltage setup signal SUVPW and the reference voltage setup signal SUVRF are activated to logic high level.

FIG. 5 is a timing diagram for describing an operation of the voltage generation circuit in FIG. 4.

The high voltage generator 210 starts boosting a power supply voltage VDD at time t0 and outputs a high voltage VPI as an internal power voltage. The word line voltage regulator 120 generates the word line voltage setup signal SUVPW activated when a first level of the incremental step pulse V1 is setup at time t1.

The high voltage detector 250 generates the reference voltage setup signal SUVRF activated when the high voltage VPI is higher than the reference voltage V3, at time t3. The timing control circuit 240 generates the program setup signal SUPGM activated when both the word line voltage setup signal SUVPW and the reference voltage setup signal SUVRF are activated. That is, time t3 is when the program setup signal SUPGM is activated and represents a time point that the column selection switch 230 can output a sufficient level of a column selection voltage VPPY, and at the same time, the word line voltage regulator 220 can output the incremental step pulse.

The word line voltage regulator 220 outputs the incremental step pulse as the word line program voltage VPW in response to the program setup signal SUPGM at time t3. A program time for the flash memory device is the sum of a delay time TD2 and a step pulse output time TSP. It can bee seen that the delay time TD2 of FIG. 5 is less than the delay time TD1 of previously described FIG. 3. As such, the voltage generation circuit 200 in FIG. 4 is capable of reducing a program time (by TD1-TD2) when compared with the voltage generation circuit 100 of previously described FIG. 2. This is because the voltage generation circuit 200 in FIG. 4 outputs the incremental step pulse as the word line program voltage VPW before the high voltage VPI is set up to the maximum value V2.

Figure 6:
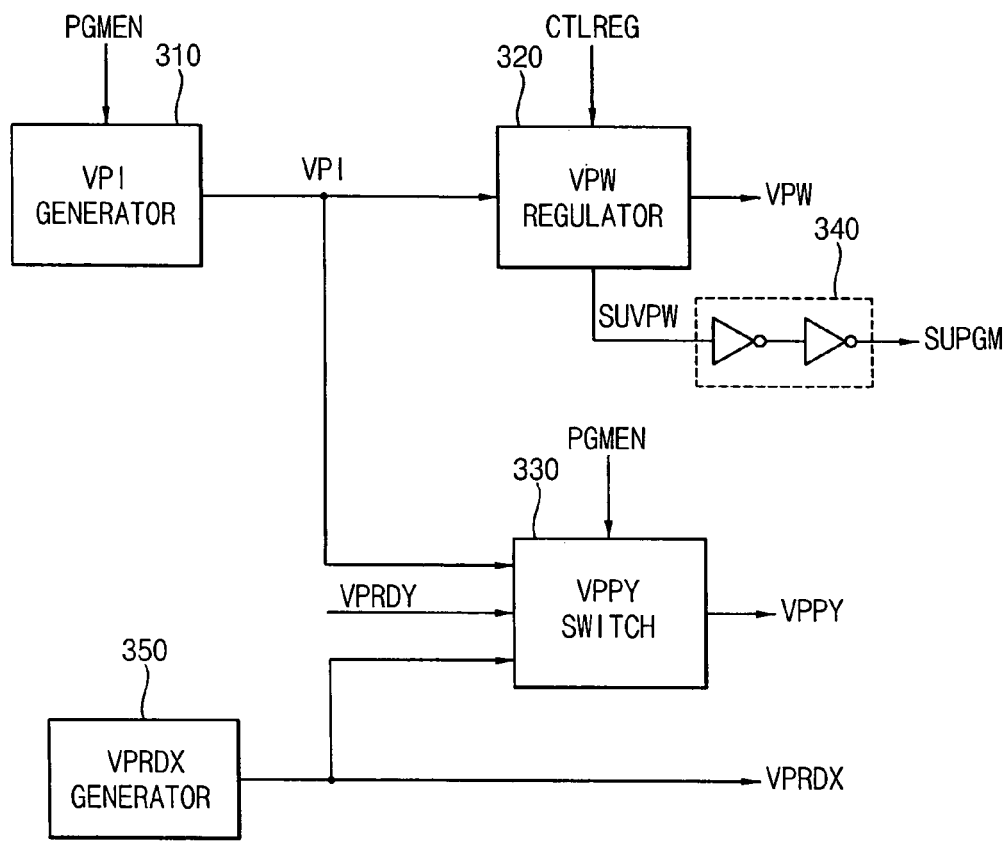
FIG. 6 is a block diagram illustrating a voltage generation circuit of a flash memory device according to an embodiment of the present invention.

FIG. 6 is a block diagram of a voltage generation circuit of a flash memory device according to another embodiment of the present invention. To avoid redundancy, the description that follows highlights the differences between the previous embodiment of FIG. 4, and omits discussion relating to aspects which are the same or similar as the embodiment of FIG. 4.

Referring to FIG. 6, the voltage generation circuit 300 of the flash memory device of this example includes a high voltage generator 310, a word line voltage regulator 320, a column selection voltage switch 330, a timing control circuit 340, and a read voltage generator 350.

The read voltage generator 350 generates a word line read voltage VPRDX in response to, for example, a power on reset signal (or a chip enable signal) of the flash memory device. That is, the read voltage generator 350 is set up to a target voltage before a program operation starts. A NOR type flash memory device includes a standby pump for generating a standby high voltage which is not less than about 4V so as to perform a prompt read operation in a read mode. The voltage generation circuit 300 may use the standby pump as the read voltage generator 350, and an example of using the standby pump as the read voltage generator 350 is illustrated in FIG. 6.

A column selection voltage switch 330 outputs the word line read voltage VPRDX as the column selection voltage VPPY in an initial stage of a program operation. The column selection voltage switch 330 compares the high voltage VPI with the word line read voltage VPRDX and outputs the high voltage VPI as the column selection voltage VPPY when the high voltage VPI is higher than the word line read voltage VPRDX.

Illustrated is the example of using the word line read voltage VPRDX as the column selection voltage VPPY in the initial stage of the program operation. However, the embodiment is not limited in this respect. For example, the standby high voltage that is set up before the program operation may be used as the column selection voltage VPPY in the initial stage of the program operation.

FIG. 7 is a circuit diagram illustrating an example of the column selection voltage switch 330 shown in FIG. 6.

Referring to FIG. 7, the column selection voltage switch 330 may include a comparator 331, a voltage switching unit 332 and a mode switching unit 333.

The comparator 331 outputs a comparison signal CMP by comparing the high voltage VPI with the word line read voltage VPRDX. The comparison signal CMP is activated when the high voltage VPI is higher than the word line read voltage VPRDX. The voltage switching unit 332 selects and outputs one of the high voltage VPI and the word line read voltage VPRDX based on the comparison signal CMP.

The high voltage VPI that is gradually increased is lower than the word line read voltage VPRDX in the initial stage of the program operation. For example, the comparison signal CMP is outputted in a logic low level when the high voltage VPI is lower than the word line read voltage VPRDX. The voltage switching unit 332 outputs the word line read voltage VPRDX as the column selection voltage VPPY in response to the logic low level of the comparison signal CMP.

A transition to a logic high level of the comparison signal CMP occurs at a time point when the high voltage VPI is increased to become higher than the word line read voltage VPRDX. The voltage switching unit 332 outputs the high voltage VPI that is sufficiently boosted as the column selection voltage VPPY in response to the logic high level of the comparison signal CMP.

The column selection voltage switch 330 outputs a read column selection voltage VPRDY that is lower than the high voltage VPI and the word line read voltage VPRDX in a read mode. The mode switching unit 333 selects a voltage corresponding to one of the program mode and the read mode, and outputs the selected voltage as the column selection voltage according to the operation mode. For example, the mode switching unit 333 included in the column selection voltage switch 330 selects an output of the voltage switching unit 332 as the column selection voltage VPPY in response to a program enable signal PGMEN representing a start of the program operation.

Referring back to FIG. 6, the word line voltage regulator 320 outputs the incremental step pulse as the word line program voltage VPW when the first voltage level of the incremental step pulse is set up. The word line voltage regulator 320 generates the word line voltage setup signal SUVPW when the first voltage level of the incremental step pulse is set up, and the timing control circuit 340 generates a program setup signal SUPGM by delaying the word line voltage setup signal. The word line voltage regulator 320 outputs the incremental step pulse to the row selection circuit of the flash memory device in response to the program setup signal SUPGM. For example, a controller of the flash memory device generates a control signal CTLREG in response to the program setup signal SUPGM, and the word line voltage regulator 320 may begin to increase the voltage level of the incremental step pulse in response to the control signal CTLREG.

In a modification of this embodiment, the timing control circuit 340 shown in FIG. 6 may be omitted and the word line voltage setup signal SUVPW may utilized as the program setup signal.

Figure 8:
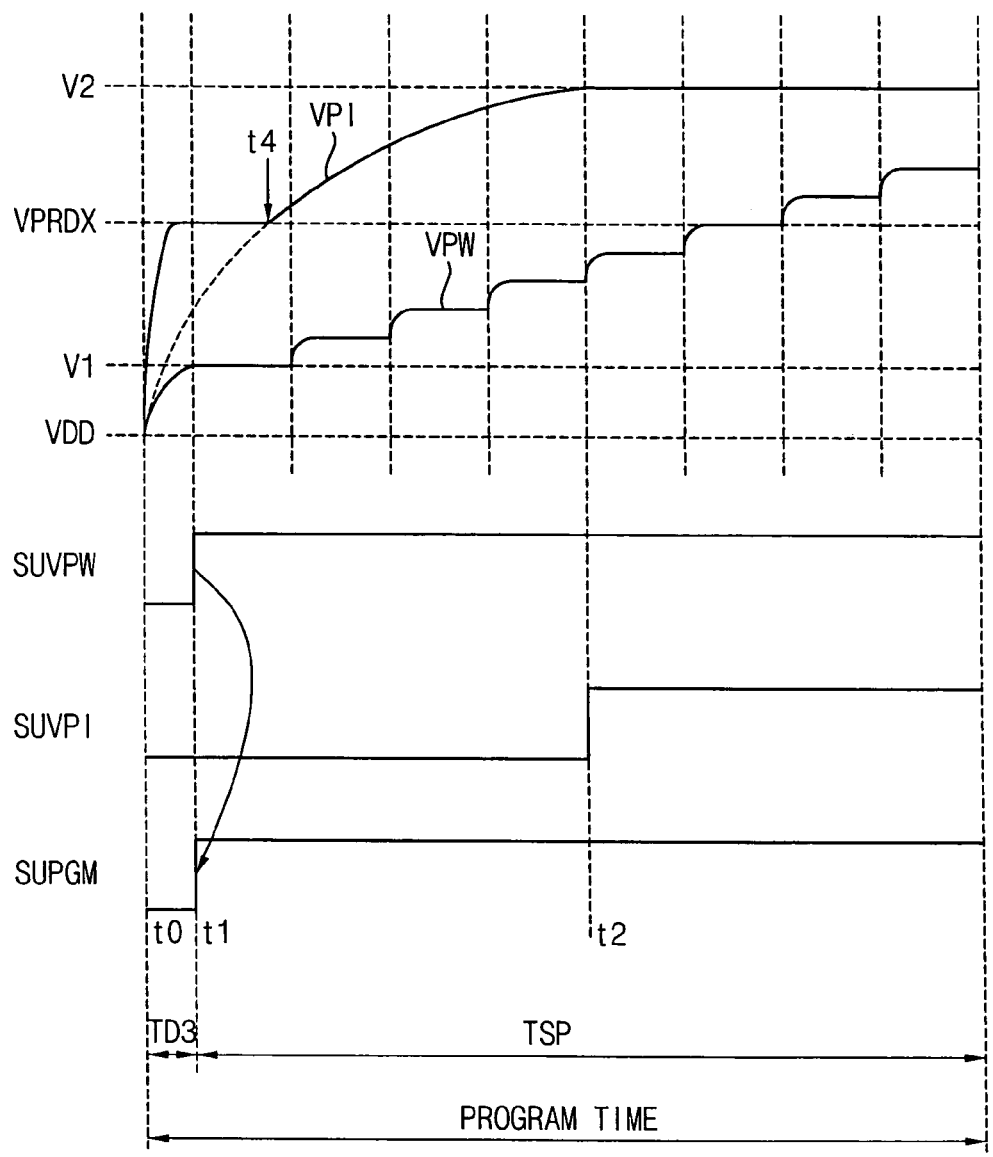
FIG. 8 is a timing diagram for describing an operation of the voltage generation circuit in FIG. 6.

FIG. 8 is a timing diagram describing an operation of the voltage generation circuit in FIG. 6.

The high voltage generator 310 starts boosting of the power supply voltage VDD at time t0 and outputs the high voltage VPI as an internal power voltage. The word line voltage regulator 320 generates the word line voltage setup signal SUVPW activated when the first voltage level of the incremental step pulse V1 is set up at time t1. The word line voltage setup signal SUVPW may be used as the program setup signal SUPGM for determining a time point (for example, the time t1 in FIG. 8) for outputting the incremental step pulse.

The word line read voltage VPRDX is outputted as the column selection voltage VPPY in the initial stage of the program operation so that the incremental step pulse is provided as the word line program voltage VPW when the first voltage level of the incremental step pulse V1 is setup (at time t1). The voltage switching unit 332 outputs the high voltage VPI as the column selection voltage VPPY at time t4 when the high voltage VPI is boosted sufficiently to become higher than the word line read voltage VPRDX.

Figure 2:
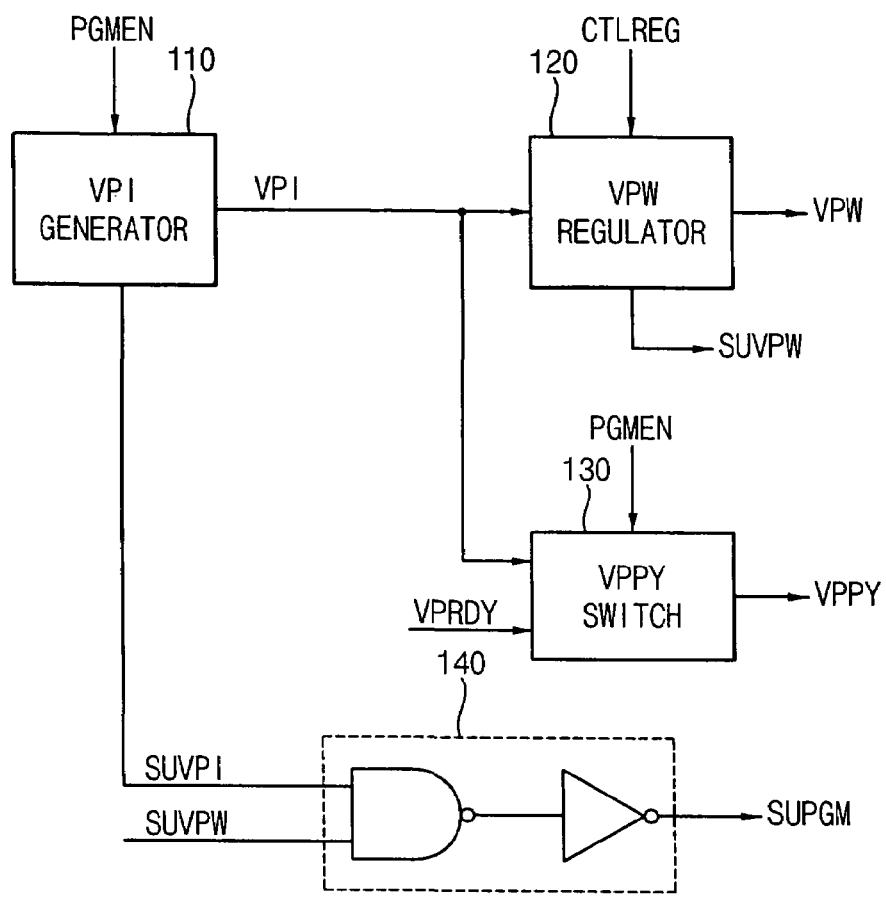
FIG. 2 is a block diagram illustrating a conventional voltage generation circuit of a flash memory device.
Figure 3:
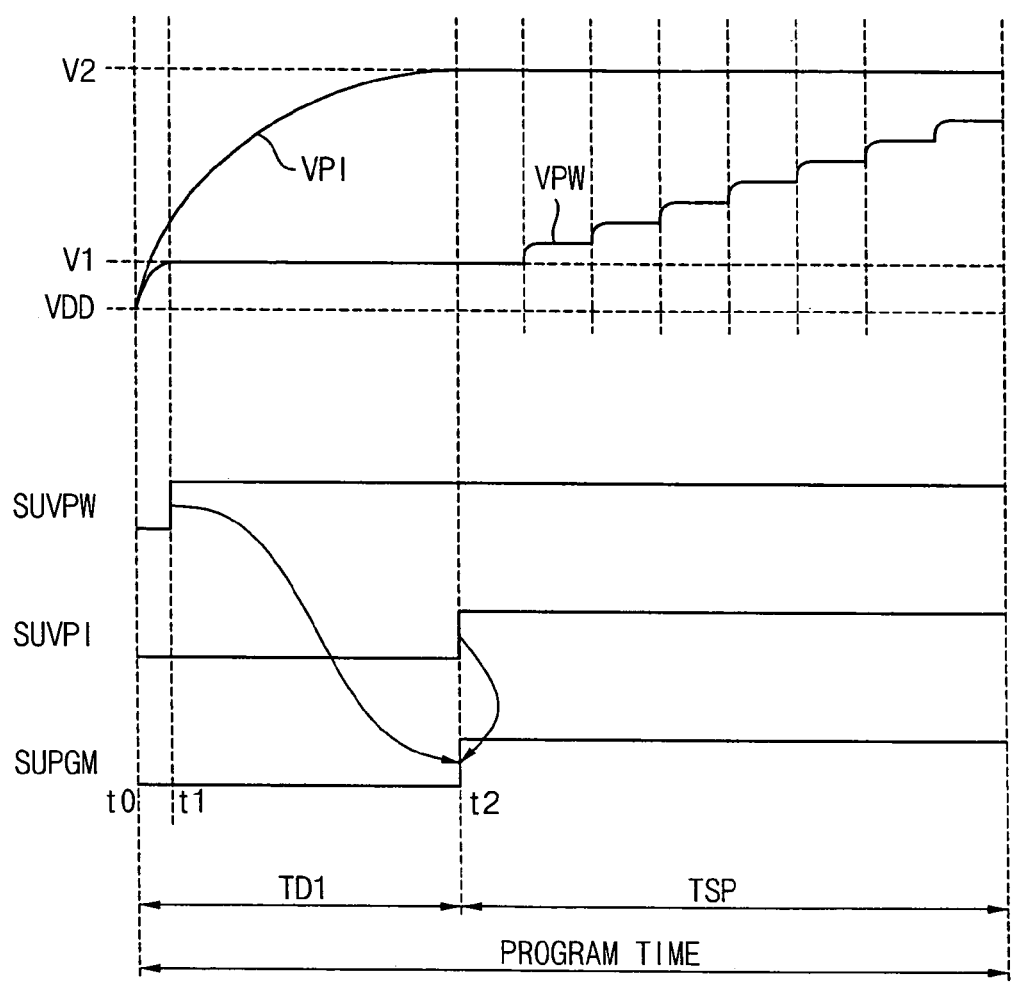
FIG. 3 is a timing diagram for describing an operation of the voltage generation circuit in FIG. 2.

In contrast to the voltage generation circuit 100 in FIG. 2 which outputs the incremental step pulse at time t2 when the high voltage VPI is set up to a maximum value v3, the voltage generation circuit 300 in FIG. 6 outputs the incremental step pulse at time t1 when the first voltage level of the incremental step pulse V1 is set up.

As shown in FIG. 8, the program time for the flash memory device is the sum of a delay time TD3 and a step pulse output time TSP. It can bee seen that the delay time TD3 of FIG. 8 is less than the delay time TD1 of previously described FIG. 3. As such, the voltage generation circuit 300 in FIG. 6 is capable of reducing a program time (by TD1-TD3) when compared with the voltage generation circuit 100 of previously described FIG. 2.

Figure 9:
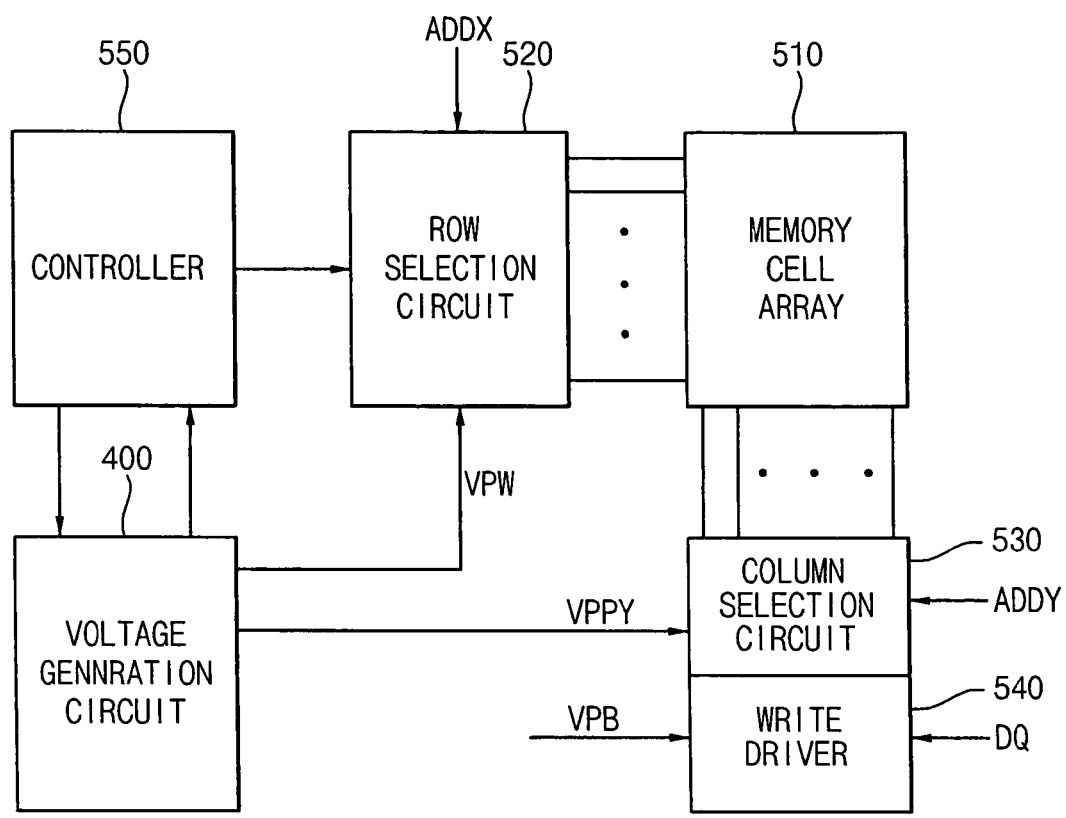
FIG. 9 is a block diagram illustrating a flash memory device according to an embodiment of the present invention.

FIG. 9 is a block diagram illustrating a flash memory device according to another embodiment of the present invention.

Referring to FIG. 9, the flash memory device 500 of this example includes a memory cell array 510, a row selection circuit 520, a column selection circuit 530, a write driver 540, a controller 550 and a voltage generation circuit 400.

The controller 550 controls a program operation of the flash memory device. The memory cell array 510 includes a plurality of cell transistors, which are respectively coupled to one of a plurality of word lines and to one of a plurality of bit lines. The row selection circuit 520 selects one of the word lines and applies a word line program voltage to the selected word line in response to a row address signal in a program mode, and the column selection circuit 530 selects one of the bit lines and applies program data to the selected bit line in response to a column address signal in the program mode. The write driver 540 outputs the program data DQ based on a bit line program voltage VPB.

The voltage generation circuit 200 in FIG. 4 or the voltage generation circuit 300 in FIG. 6 may be used as the voltage generation circuit 400 of FIG. 9 for reducing the program time for the flash memory device. The voltage generation circuit 400 outputs an incremental step pulse as the word line program voltage VPW to the row selection circuit 520 before the high voltage VPI is set up to the maximum value. In addition, the voltage generation circuit 400 outputs a column selection voltage VPPY for selecting a bit line to the column selection circuit 530 based on the high voltage VPI.

As described above, in case where the voltage generation circuit 200 of FIG. 4 is used as the voltage generation circuit 400 of FIG. 9, the incremental step pulse may be outputted as the word line program voltage VPW to the row selection circuit 520 when the high voltage VPI is boosted to the voltage level which is sufficient to be used as the column selection voltage VPPY, before the high voltage VPI is set up to the maximum value. In case where the voltage generation circuit 300 of FIG. 6 is used as the voltage generation circuit 400 of FIG. 9, the incremental step pulse may be outputted as the word line program voltage VPW to the row selection circuit 520 when the first voltage level of the incremental step pulse is set up, regardless of the setup time of the high voltage VPI. Accordingly, the flash memory device 500 is capable of reducing unnecessary latency time, thereby decreasing the program time. The controller 550 controls the program operation corresponding to the decreased program time.

Figure 10:
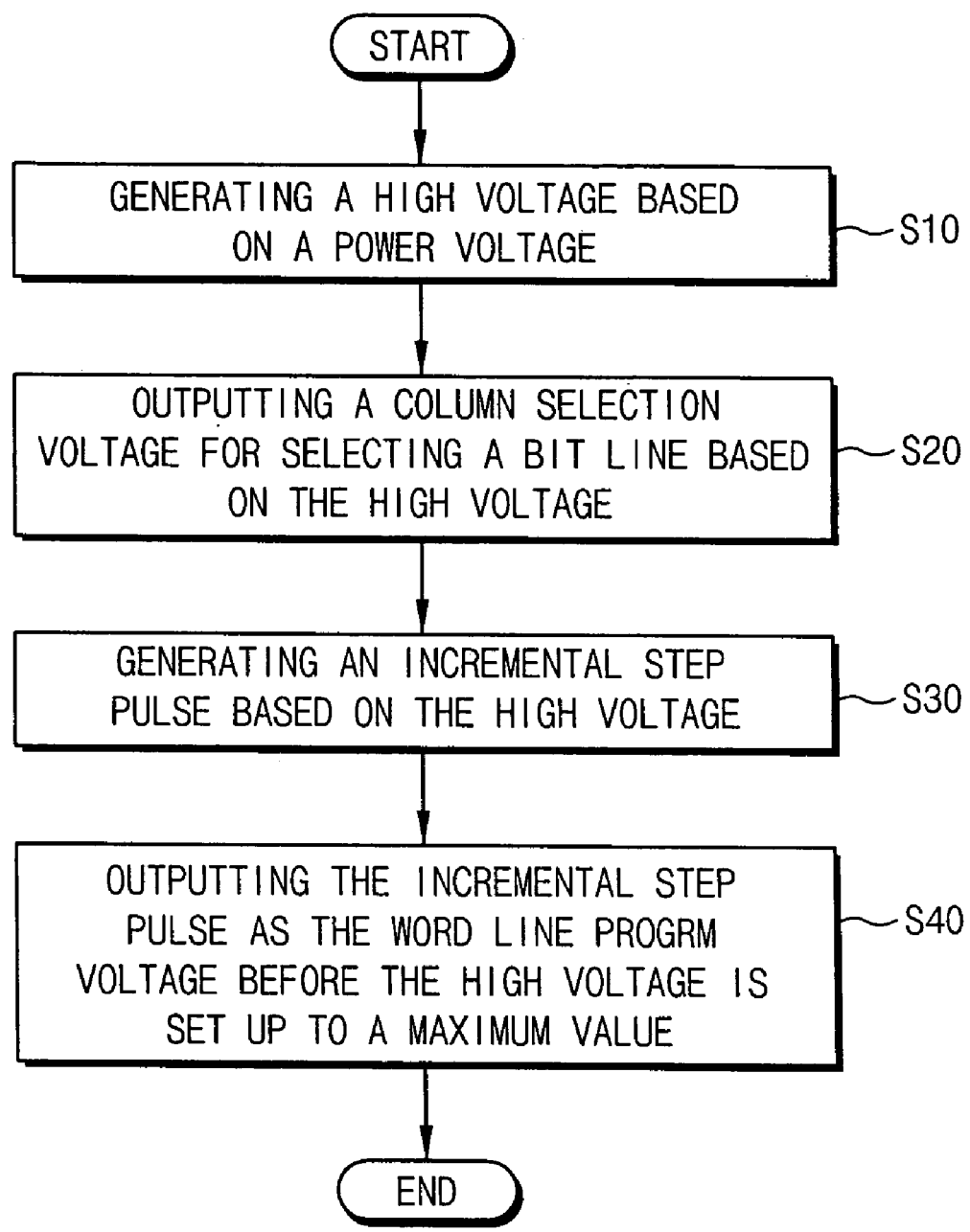
FIG. 10 is a flow chart illustrating a method of programming a flash memory device according to an embodiment of the present invention.

FIG. 10 is a flow chart illustrating a method for programming a flash memory device according to an embodiment of the present invention.

Referring to FIG. 10, a high voltage is generated based on a power voltage for a program operation of the flash memory device (Step S10). A column selection voltage for selecting a bit line is outputted based on the high voltage (Step S20), and an incremental step pulse is generated based on the high voltage (Step S30). In order to reduce a program time, the incremental step pulse is outputted as the word line program voltage before the high voltage is set up to the maximum value (Step S40).

The incremental step pulse may be outputted as the word line program voltage when the high voltage is higher than a reference voltage and the first voltage level of the incremental step pulse is set up. In this case, the outputting of the incremental step pulse as the word line program voltage (Step S30) may be performed by comparing the high voltage with a reference voltage, and detecting whether the first voltage level of the incremental step pulse is set up. That is, the incremental step pulse is outputted as the word line program voltage when the high voltage is higher than the reference voltage and the first voltage level of the incremental step pulse is set up.

As described above, the reference voltage may be set up to a minimum value of the column selection voltage for operating a bit line selection transistor in a program mode.

Meanwhile, to output the column selection voltage (Step S20), a standby high voltage generated in response to a power on reset signal of the flash memory device may be used. The standby high voltage may be outputted as the column selection voltage in an initial stage of program operation. The high voltage is compared with the standby high voltage and the high voltage is outputted as the column selection voltage when the high voltage is higher than the standby high voltage. Accordingly, when the voltage level of the incremental step pulse is increased to the maximum value, the high voltage can be transferred to the column selection voltage because the high voltage is sufficiently boosted.

In case of using the standby high voltage (for example, the word line read voltage) which is powered up before start of the program operation, the incremental step pulse can be outputted as the word line program voltage when the first voltage level of the incremental step pulse is set up. Accordingly, the program time of the flash memory device may be reduced.

The present invention may be applied to cases in which a high bit line voltage, and thus high column selection voltage, is required in program mode. The present invention is not limited to a NOR type flash memory device, and those skilled in the art will readily understand, for example, that the present invention may be applied to a flash memory device using an ISSP scheme and requiring a high column selection voltage.

While the example embodiments of the present invention and their advantages have been described in detail, it should be understood that various changes, substitutions and alterations may be made herein without departing from the scope of the invention.

What is claimed is:

1. A voltage generation circuit of a flash memory device, comprising:
   a high voltage generator configured to increase an internal power voltage from a first voltage to a second voltage which is higher than the first voltage;
   a word line voltage regulator configured to generate an incremental step pulse based on the internal power voltage, wherein the incremental step pulse is output as a word line program voltage before the internal power voltage reaches the second voltage;

a column selection voltage switch configured to output a column selection voltage for selecting a bit line based on the internal power voltage.

2. The voltage generation circuit of claim 1, wherein the first voltage is a power supply voltage.

3. The voltage generation circuit of claim 1, further comprising a high voltage detector configured to compare the internal power voltage with a reference voltage and to generate a reference voltage setup signal that is activated when the internal power voltage is higher than the reference voltage.

4. The voltage generation circuit of claim 3, wherein the reference voltage corresponds to a minimum value of the column selection voltage for operating a bit line selection transistor in a program mode.

5. The voltage generation circuit of claim 3, wherein the high voltage detector comprises a comparator configured to compare the internal power voltage with the reference voltage and to generate the reference voltage setup signal.

6. The voltage generation circuit of claim 3, wherein the word line voltage regulator is configured to generate a word line voltage setup signal and output the incremental step pulse as the word line program voltage in response to a program setup signal, the word line set up signal being activated when a first voltage level of the incremental step pulse is set up, the program setup signal being activated when both the word line voltage setup signal and the reference voltage setup signal are activated.

7. The voltage generation circuit of claim 6, further comprising;
a timing control circuit configured to generate the program setup signal by performing a logical operation on the word line voltage setup signal and the reference voltage set up signal.

8. The voltage generation circuit of claim 1, further comprising;
a standby pump configured to generate a standby voltage which is higher than the first voltage and less than the second voltage in response to a power on reset signal of the flash memory device.

9. The voltage generation circuit of claim 8, wherein the word line voltage regulator is configured to output the incremental step pulse as the word line program voltage when a first voltage level of the incremental step pulse is set up.

10. The voltage generation circuit of claim 8, wherein the column selection voltage switch is configured to output the standby voltage as the column selection voltage in an initial stage of a program operation, and to output the internal power voltage as the column selection voltage when the internal power voltage is higher than the standby voltage.

11. The voltage generation circuit of claim 10, wherein the column selection voltage switch comprises:
a comparator configured to generate a comparison signal by comparing the internal power voltage with the standby voltage; and
a voltage switching unit configured to select and output one of the internal power voltage and the standby voltage based on the comparison signal.

12. The voltage generation circuit of claim 1, wherein the column selection voltage switch comprises a mode switching unit configured to select a voltage corresponding to one of a program mode and a read mode and to output the selected voltage as the column selection voltage.

13. The voltage generation circuit of claim 1, wherein the flash memory device is a NOR type flash memory device.

14. A flash memory device comprising:
a controller configured to control a program operation;
a memory cell array including a plurality of cell transistors that are respectively coupled to one of a plurality of word lines and to one of a plurality of bit lines;
a row selection circuit configured to select one of the word lines based on a row address signal and to apply a word line program voltage to the selected word line in program mode;
a column selection circuit configured to select one of the bit lines based on a column address signal and to apply program data to the selected bit line in program mode;
a write driver configured to output the program data based on a bit line program voltage; and
a voltage generation circuit configured to output an incremental step pulse as a word line program voltage to the row selection circuit before an internal power voltage is increased to a maximum voltage from an initial voltage, and to output a column selection voltage for selecting a bit line to the column selection circuit based on the internal power voltage.

15. The flash memory device of claim 14, wherein the initial voltage is a power supply voltage.

16. The flash memory device of claim 14, wherein the voltage generation circuit comprises:
a high voltage generator configured to increase the internal power voltage from the initial voltage to the maximum voltage;
a word line voltage regulator configured to generate the incremental step pulse based on the internal power voltage, wherein the incremental step pulse is output as a word line program voltage before the internal power voltage reaches the maximum voltage;
a column selection voltage switch configured to output a column selection voltage for selecting a bit line based on the internal power voltage.

17. The flash memory device of claim 16, wherein the voltage generation circuit further comprises a high voltage detector configured to compare the internal power voltage with a reference voltage, and generate a reference voltage setup signal that is activated when the internal power voltage is higher than the reference voltage, and
wherein the word line voltage regulator is configured to generate a word line voltage setup signal and output the incremental step pulse as the word line program voltage when both the word line voltage setup signal and the reference voltage setup signal are activate, the word line voltage setup signal being activated when a first voltage level of the incremental step pulse is set up.

18. The flash memory device of claim 16, wherein the voltage generation circuit further comprises a standby pump configured to generate a standby voltage which is greater than the initial voltage and less than the maximum voltage in response to a power on reset signal of the flash memory device, and
wherein the word line voltage regulator is configured to output the incremental step pulse as the word line program voltage when a first voltage level of the incremental step pulse is set up.

19. The flash memory device of claim 18, wherein the column selection voltage switch is configured to compare the internal power voltage with the standby voltage, to output the standby voltage as the column selection voltage in an initial stage of program operation, and to output the internal power voltage as the column selection voltage when the internal power voltage is higher the standby voltage.

20. The flash memory device of claim 14, wherein the flash memory device is a NOR type flash memory device.

21. A method for programming flash memory device, comprising:
   increasing an internal power voltage from a first voltage to a second voltage which is higher then the first voltage;
   outputting a column selection voltage for selecting a bit line based on the internal power voltage;
   generating an incremental step pulse based on the internal power voltage; and
   outputting the incremental step pulse as a word line program voltage before the internal power voltage reaches the second voltage from the first voltage level.

22. The method of claim 21, wherein outputting the incremental step pulse as a word line program voltage includes outputting the incremental step pulse as the word line program voltage when the internal power voltage is higher than a reference voltage and a first voltage level of the incremental step pulse is set up.

23. The method of claim 21, wherein outputting the incremental step pulse as a word line program voltage comprises:
   comparing the internal power voltage with a reference voltage;
   detecting whether the first voltage level of the incremental step pulse is set up; and
   outputting the incremental step pulse as the word line program voltage when the internal power voltage is higher than the reference voltage and the first voltage level of the incremental step pulse is set up.

24. The method of claim 22, wherein the reference voltage is a minimum value of the column selection voltage for operating a bit line selection transistor in program mode.

25. The method of claim 21, wherein outputting the column selection voltage comprises:
   generating a standby voltage which is higher than the first voltage and less than the second voltage based on a power on reset signal of the flash memory device;
   outputting the standby voltage as the column selection voltage in the initial stage of program operation;
   comparing the internal power voltage with the standby voltage; and
   outputting the internal power voltage as the column selection voltage when the internal power voltage is higher than the standby voltage.

26. The method of claim 25, wherein outputting the incremental step pulse as the word line program voltage comprises:
   detecting whether a first voltage level of the incremental step pulse is set up; and
   outputting the incremental step pulse as the word line program voltage when the first voltage level of the incremental step pulse is set up.

27. The method of claim 21, wherein the flash memory device is a NOR type flash memory device.

* * * * *